(12) United States Patent
Nakao et al.

(10) Patent No.: US 8,164,160 B2
(45) Date of Patent: Apr. 24, 2012

(54) SEMICONDUCTOR DEVICE

(75) Inventors: Yuichi Nakao, Kyoto (JP); Takahisa Yamaha, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/155,232

(22) Filed: May 30, 2008

(65) Prior Publication Data
US 2008/0296730 A1 Dec. 4, 2008

(30) Foreign Application Priority Data

May 31, 2007 (JP) ................................. 2007-145809

(51) Int. Cl.
H01L 29/92 (2006.01)
(52) U.S. Cl. ............... 257/532; 257/751; 257/E29.343; 257/758; 257/761; 257/762; 257/763
(58) Field of Classification Search .................. 257/758, 257/760–765, E23.144, E23.145, 532, 751, 257/E29.343; 438/622–672
See application file for complete search history.

(56) References Cited

U.S. PATENT DOCUMENTS

| | | | |
|---|---|---|---|
| 6,492,735 B1 * | 12/2002 | Matsubara | .................... 257/760 |
| 7,087,997 B2 * | 8/2006 | Burrell et al. | ................. 257/750 |
| 2003/0003727 A1 | 1/2003 | Matsubara | |
| 2004/0124537 A1 | 7/2004 | Takayama et al. | |
| 2005/0054191 A1 * | 3/2005 | Yu et al. | ......................... 438/629 |
| 2007/0026673 A1 | 2/2007 | Takayama et al. | |
| 2007/0176243 A1 * | 8/2007 | Watanabe | ..................... 257/379 |
| 2008/0153244 A1 * | 6/2008 | Shih | ............................. 438/381 |

FOREIGN PATENT DOCUMENTS

| | | |
|---|---|---|
| JP | 2001-093976 | 4/2001 |
| JP | 2004-207281 | 7/2004 |

* cited by examiner

Primary Examiner — Lynne Gurley
Assistant Examiner — Naima Kearney
(74) Attorney, Agent, or Firm — Rabin & Berdo, P.C.

(57) ABSTRACT

A semiconductor device according to the present invention has a multilayer wiring structure laminating and disposing a plurality of with sandwiching an insulating film and includes: a copper wire having copper as a main component; an insulating film formed on the copper wire; an aluminum wire having aluminum as a main component and formed on the insulating film to be electrically connected to the copper wire via a via hole formed to penetrate through the insulating film; and a surface protective film formed on the aluminum wire; and the surface protective film formed with a pad opening exposing a portion of the aluminum wire as an electrode pad for electrical connection with an external portion.

12 Claims, 15 Drawing Sheets

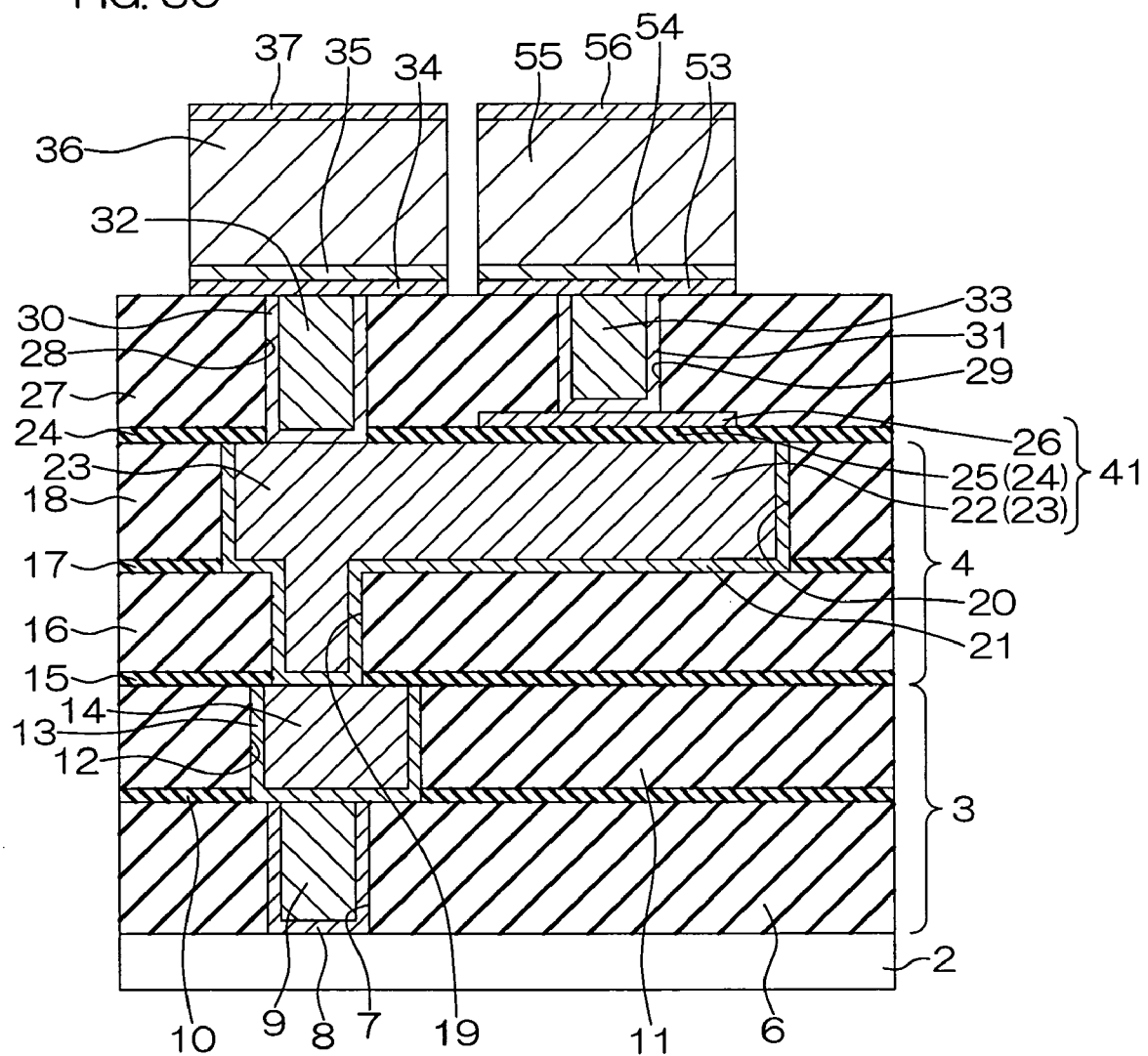

SEMICONDUCTOR DEVICE

BACKGROUND OF THE INVENTION

1. Field of the Invention

The present invention relates to a semiconductor device with a multilayer wiring structure.

2. Description of Related Art

A so-called multilayer wiring structure, in which a plurality of wiring layers are laminated on a semiconductor substrate, is employed in a semiconductor device, such as an LSI of a high integration.

In semiconductor devices employing such a multilayer wiring structure, in place of Al (aluminum) which has been conventionally used as a wiring material, application of Cu (copper), which is higher in conductivity is being studied in order to reduce wiring resistance.

In a multilayer wiring structure using a Cu wiring material, a first insulating film formed of $SiO_2$ (silicon oxide) is laminated onto a semiconductor substrate formed of Si (silicon). A microscopic wiring groove corresponding to a predetermined wiring pattern is formed in a surface layer portion of the first insulating film. In the wiring groove, a first Cu wire is embedded via a Ta (tantalum-based) barrier film for preventing diffusion of Cu into the insulating film.

A second insulating film formed of $SiO_2$ is laminated on the first insulating film. A microscopic wiring groove corresponding to a predetermined wiring pattern is formed in the second insulating film. Furthermore, in the second insulating film, a via hole is penetratingly formed at a portion where the wiring groove opposes the first Cu wire. A second Cu wire is embedded together in the wiring groove and the via hole via a Ta (tantalum-based) barrier film for preventing diffusion of Cu into the insulating film. The second Cu wire is thereby electrically connected to the first Cu wire.

An insulating film formed of $SiO_2$ and a surface protective film formed of SiN (silicon nitride) are formed on the second insulating film. A penetrating hole for exposing a portion of the second Cu wire for electrical connection to an external portion is formed at portions of the surface protective film that oppose the second Cu wire.

However, because Cu has a property of corroding due to oxidation, when the portion of the second Cu wire is left exposed from the penetrating hole, the exposed portion of the second Cu wire becomes corroded and reliability of electrical connection with the external portion may degrade. Thus, in the conventional semiconductor device, the exposed portion of the second Cu wire is covered by an electrode pad formed of Al (aluminum) having excellent corrosion resistance.

More specifically, a third insulating film formed of $SiO_2$ is formed on the second insulating film. A connection opening that exposes a portion of the second Cu wire is formed at a portion of the third insulating film that opposes the second Cu wire. An electrode pad of a predetermined pattern made of Al is formed so as to coat an interior of the connection opening and a peripheral portion of the connection opening on a surface of the third insulating film. The electrode pad is electrically connected to the second Cu wire via the connection opening.

A surface protective film formed of SiN is formed on the third insulating film on which the electrode pad is formed. In the surface protective film, a pad opening is formed for exposing the electrode pad.

In order to form the electrode pad made of Al, after forming the second Cu wire in a process for manufacturing the semiconductor device, following steps must be carried out additionally, such as: forming the third insulating film→forming the connection opening→forming the electrode pad→forming the surface protective film→forming the pad opening consequently, the increase of the number of manufacturing steps leads to increase of manufacturing cost.

SUMMARY OF THE INVENTION

An object of the present invention is to provide a semiconductor device having an electrode pad that is high in reliability of electrical connection with an external portion and is formed without increasing manufacturing steps in a semiconductor device having a multilayer wiring structure.

A semiconductor device according to the present invention has a multilayer wiring structure laminating and disposing a plurality of wires with sandwiching an insulating film and includes: a copper wire having copper as a main component; an insulating film formed on the copper wire; an aluminum wire having aluminum as a main component and formed on the insulating film to be electrically connected to the copper wire via a via hole formed to penetrate through the insulating film; and a surface protective film formed on the aluminum wire; and the surface protective film formed with a pad opening exposing a portion of the aluminum wire as an electrode pad for electrical connection with an external portion.

The semiconductor device having the multilayer wiring structure has the copper wire having copper as the main component. The insulating film is formed on the copper wire. The aluminum wire having aluminum as the main component and electrically connected to the copper wire via the via hole formed to penetrate through the insulating film is formed on the insulating film. The surface protective film is formed on the aluminum wire. The pad opening exposing the portion of the aluminum wire as the electrode pad for electrical connection with the external portion is formed in the surface protective film.

Because the material of the wire exposed as the electrode pad from the pad opening is aluminum, which has excellent corrosion resistance, even if the portion of the aluminum wire corresponding the electrode pad is left in the exposed state from the pad opening, this portion does not corrode. A semiconductor device having an electrode pad with a high reliability of electrical connection with an external portion can thus be realized.

The aluminum wire is a portion of the wires of the multilayer wiring structure. A step of forming a layer (aluminum wiring layer) on which the aluminum wire is provided is included in the steps for forming the multilayer wiring layers. Therefore, the number of steps of a process for manufacturing the semiconductor device as a whole is not increased due to the forming of the aluminum wire. Consequently, increase of manufacturing cost of the semiconductor device can be prevented. That is, the aluminum wire is an uppermost layer wire in the multilayer wire structure and, at the same time, a portion thereof functions as the electrode pad.

Preferably, the semiconductor device includes: a lower electrode made of a portion of the copper wire; a capacitive film formed on the lower electrode; and an upper electrode formed on the capacitive film.

Because the lower electrode made of the portion of the copper wire, the capacitive film formed on the lower electrode, and the upper electrode formed on the capacitive film are provided, a structure made of the lower electrode, the capacitive film, and the upper electrode can be used as a so-called MIM capacitor. Because the lower electrode is made of the portion of the copper wire, forming of the lower electrode is achieved by forming of the copper wire. Thus in comparison to a case where an MIM capacitor is prepared separately from the steps of forming the multilayer wiring layers, a semiconductor device having the MIM capacitor can be manufactured at low cost.

Also preferably, the semiconductor device includes a tungsten plug formed inside the via hole and made of tungsten for electrically connecting the copper wire and the aluminum wire.

In order to connect the copper wire and the aluminum wire using the tungsten plug, first, for example, an inner surface of the via hole and a surface of the insulating film is deposited with a barrier film. A tungsten film made of tungsten is then deposited onto the barrier film. All portions of the tungsten film outside the via hole are then polished by a CMP method. The tungsten film remaining inside the via hole thereby becomes the tungsten plug. The tungsten plug thus obtained has a recess that is recessed with respect to the surface of the insulating film. After the tungsten plug is formed, an aluminum film formed of aluminum is sputtered onto the insulating film. A portion of the aluminum film immediately above the recess of the tungsten plug is formed to a shape having a recess. The aluminum film is then patterned to a predetermined wiring pattern by a photolithography technique. The aluminum wire with the predetermined wiring pattern is thus formed.

In patterning the aluminum film, the aluminum film can be patterned by the photolithography technique using the recess of the aluminum film as a mark. Thus in the arrangement in which the copper wire and the aluminum wire are electrically connected with the tungsten plug, because the aluminum wire can be formed readily, the manufacturing process can be simplified. By the simplification of the manufacturing process, the manufacturing cost can be reduced.

Furthermore preferably, the semiconductor device includes a barrier layer interposed between the copper wire and the tungsten plug and the barrier layer includes a tantalum film contacting the copper wire and a titanium nitride film contacting the tungsten plug.

In this arrangement, the titanium nitride film is the portion of the barrier layer that contacts the tungsten plug. Thus even when the tungsten plug is formed by a CVD method using tungsten hexafluoride gas ($WF_6$ gas), the $WF_6$ gas can be prevented from diffusing into the insulating film and corroding the insulating film.

In addition, because the tungsten plug contacts the titanium nitride film that is excellent in adhesion with tungsten, adhesion of the barrier layer and the tungsten plug can be improved. Meanwhile, because the copper wire contacts the tantalum film that is excellent in adhesion with copper, adhesion of the barrier layer and the copper wire can be improved. Accordingly, layer peeling of the barrier layer can be prevented. Therefore, occurrence of stress migration can be prevented. Furthermore, because the titanium nitride film and the copper wire are not in contact and because tantalum is low in reactivity with copper, corrosion of the copper wire does not occur. Thus occurrence of electromigration can be prevented.

Consequently, the reliability of connection of the copper wire and the aluminum wire can be improved.

The above and further objects, characteristics, and effects of the present invention shall be made clearer by the following description of embodiments with reference to the attached drawings.

DETAILED DESCRIPTION OF THE INVENTION

Figure 1:
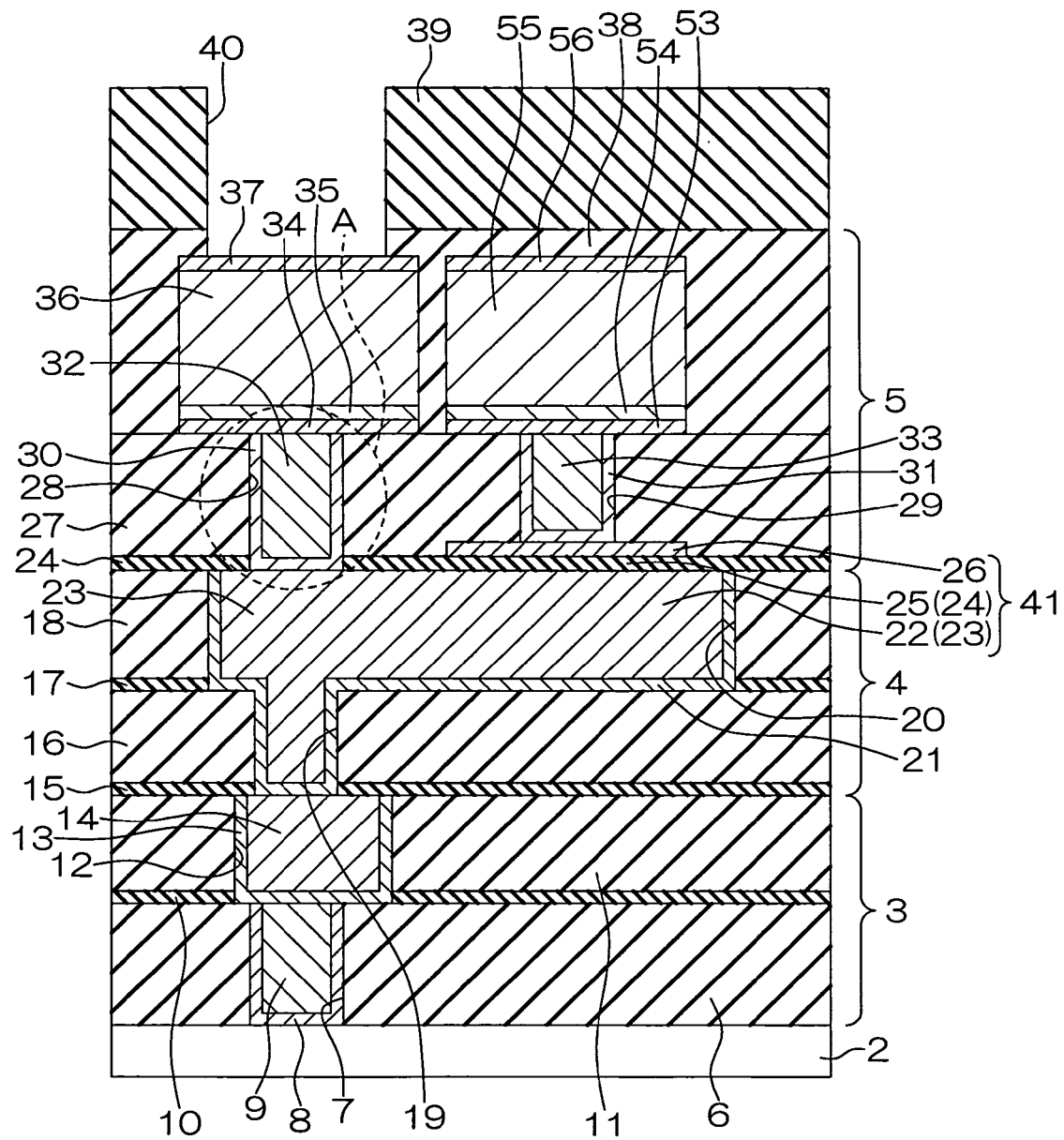
FIG. 1 is a schematic sectional view showing an arrangement of a semiconductor device according to a first embodiment of the present invention.

FIG. 1 is a schematic sectional view showing an arrangement of a semiconductor device according to a first embodiment of the present invention.

On a semiconductor substrate 2 formed of Si (silicon), for example, the semiconductor device 1 has a multilayer wiring structure having a first wiring layer 3, a second wiring layer 4, and a third wiring layer 5 laminated in that order starting from the semiconductor substrate 2 side.

A functional device (not shown), such as MOSFET (metal oxide semiconductor field effect transistor), is built on a surface layer portion of the semiconductor substrate 2.

The first wiring layer 3 includes an interlayer film 6 formed of $SiO_2$ (silicon oxide) and laminated on the semiconductor substrate 2, a diffusion preventing film 10 formed of SiC (silicon carbide) laminated on the interlayer film 6, and an interlayer film 11 formed of $SiO_2$ and laminated on the diffusion preventing film 10.

In the interlayer film 11 and the diffusion preventing film 10 a wiring groove 12 of a predetermined pattern is formed that penetrates through these films in a film thickness direction.

In the interlayer film 6, a contact hole 7 penetrating through the interlayer film 6 in the film thickness direction is formed at a portion where the semiconductor substrate 2 and the wiring groove 12 oppose each other. A portion of a surface of the semiconductor substrate 2 that faces the contact hole 7 functions as a contact for electrical contact with the functional device.

A tantalum barrier film 13 is deposited onto side surfaces and a bottom surface of the wiring groove 12. The tantalum barrier film 13 has, for example, a single-layer structure formed of a tantalum film deposited onto the side surfaces and the bottom surface of the wiring groove 12, or a two-layer structure formed of a tantalum nitride film and a tantalum film deposited onto the tantalum nitride film.

A copper wire 14 formed of a metal having copper (hereinafter may be referred to as "Cu") as a main component is embedded in the wiring groove 12, onto which the tantalum barrier film 13 is deposited.

A titanium nitride barrier film 8 formed of TiN (titanium nitride) is deposited onto side surfaces of the contact hole 7 and the portion (contact) of the semiconductor substrate 2 facing the interior of the contact hole 7.

A tungsten plug 9 formed of tungsten (hereinafter may be referred to as "W") is embedded in the contact hole 7 deposited with the titanium nitride barrier film 8. The tungsten plug 9 fills up the contact hole 7 and an upper surface thereof is flush with an upper surface of the interlayer film 6. With the tungsten plug 9, the copper wire 14 and the contact of the semiconductor substrate 2 are electrically connected.

The second wiring layer 4 includes a diffusion preventing film 15 formed of SiC and laminated on the interlayer film 11, an interlayer film 16 formed of $SiO_2$ and laminated on the diffusion preventing film 15, an etch stop film 17 formed of SiC and laminated on the interlayer film 16, and an interlayer film 18 formed of $SiO_2$ and laminated on the etch stop film 17.

In the interlayer film 18 and the etch stop film 17, a wiring groove 20 of a predetermined pattern is formed that penetrates through these films in the film thickness direction.

In the interlayer film 16 and the diffusion preventing film 15, a via hole 19 penetrating through these films in the film thickness direction is formed at a portion where the copper wire 14 and the wiring groove 20 oppose each other.

A tantalum barrier film 21 is deposited onto side surfaces and bottom surfaces of the wiring groove 20, side surfaces of the via hole 19, and a portion of the copper wire 14 that faces an interior of the via hole 19.

The tantalum barrier film 21 has, for example, a single-layer structure formed of a tantalum film deposited onto the side surfaces and the bottom surfaces of the wiring groove 20, the side surfaces of the via hole 19, and the portion of the copper wire 14 that faces the interior of the via hole 19, or a two-layer structure formed of a tantalum nitride film and a tantalum film deposited onto the tantalum nitride film.

A copper wire 23 formed of a metal having copper (Cu) as a main component is embedded in the via hole 19 and the wiring groove 20 deposited with the tantalum barrier film 21. The copper wire 23 fills up the wiring groove 20 and an upper surface thereof is flush with an upper surface of the interlayer film 18. The copper wire 23 also fills up the via hole 19. The copper wire 23 is thereby electrically connected to the copper wire 14 via the tantalum barrier film 21.

The third wiring layer 5 includes a diffusion preventing film 24 formed of SiC and laminated on the interlayer film 18, an interlayer film 27 (insulating film) formed of $SiO_2$ and laminated on the diffusion preventing film 24, and an interlayer film 38 formed of $SiO_2$ and laminated on the interlayer film 27.

An aluminum wire 36 of a predetermined pattern and made of a metal having aluminum (which hereinafter may be referred to as "Al") as a main component (for example, an Al—Cu alloy) is formed in the interlayer film 38. The aluminum wire 36 is sandwiched by a barrier film in a two-layer structure having a titanium nitride barrier film 35 formed of TiN (titanium nitride) and deposited onto a lower surface of the aluminum wire 36, and a titanium barrier film 34 formed of Ti (titanium) and deposited onto the titanium nitride barrier film 35, and a titanium nitride barrier film 37 formed of TiN (titanium nitride) and deposited onto an upper surface of the aluminum wire 36 (hereinafter, unless specified otherwise, the aluminum wire 36 includes the titanium barrier 34, the titanium nitride barrier film 35, and the titanium nitride barrier 37). In place of the barrier film in the two-layer structure having the titanium barrier film 34 and the titanium nitride barrier film 35, a single-layer barrier film made of titanium nitride may be formed.

In the interlayer film 27 and the diffusion preventing film 24, a via hole 28 for penetrating through these films in the film thickness direction is formed at a portion where the copper wire 23 and the aluminum wire 36 oppose each other.

A conductive laminated barrier film 30 is deposited onto side surfaces of the via hole 28 and a portion of the copper wire 23 that faces an interior of the via hole 28. A specific arrangement of the laminated barrier film 30 shall be described in detail later with reference to FIG. 2.

A tungsten plug 32 formed of tungsten is embedded in the via hole 28 deposited with the laminated barrier film 30. The tungsten plug 32 fills up the via hole 28 and an upper surface thereof is flush with an upper surface of the interlayer film 27. The aluminum wire 36 and the copper wire 23 are connected electrically with the tungsten plug 32.

A surface protective film 39 formed of SiN is laminated on the interlayer film 38. In the interlayer film 38 and the surface protective film 39, a pad opening 40 is formed that exposes the aluminum wire 36 as an electrode pad for electrical connection with an external portion.

The semiconductor device 1 has an MIM capacitor 41.

The MIM capacitor 41 includes a lower electrode 22 formed of a portion of the copper wire 23, a capacitive film 25 formed of a portion of the diffusion preventing film 24 and having both a function as a diffusion preventing film and a function as a capacitive film, and an upper electrode 26 formed of titanium nitride and laminated on the capacitive film 25. The upper electrode 26 opposes the lower electrode 22 with sandwiching the capacitive film 25. Accordingly, an MIM structure is formed of: a metal (lower electrode 22)—an insulator (capacitive film 25)—a metal (upper electrode 26). The capacitive film 25 and the upper electrode 26 are coated with the interlayer film 27.

In the interlayer film 38, an aluminum wire 55 of a predetermined pattern and made of a metal having aluminum as a main component (for example, an Al—Cu alloy) is formed at a portion opposing the MIM capacitor 41. The aluminum wire 55 is sandwiched by a barrier film in a two-layer structure having a titanium nitride barrier film 54 formed of titanium nitride and deposited onto a lower surface of the aluminum wire 55, and a titanium barrier film 53 formed of titanium and deposited onto the titanium nitride barrier film 54, and a titanium nitride barrier film 56 formed of titanium nitride and deposited onto an upper surface of the aluminum wire 55 (hereinafter, unless specified otherwise, the aluminum wire 55 includes the titanium barrier film 53, the titanium nitride barrier film 54, and the titanium nitride barrier film 56). In place of the barrier film in the two-layer structure having the titanium barrier film 53 and the titanium nitride barrier film 54, a single-layer barrier film made of titanium nitride may be formed.

In the interlayer film 27, a contact hole 29 for penetrating through the interlayer film 27 in the film thickness direction is formed at a portion where the MIM capacitor 41 and the aluminum wire 55 oppose each other.

A conductive laminated barrier film 31 is deposited onto side surfaces of the contact hole 29 and a portion of the upper electrode 26 that faces an interior of the contact hole 29. The laminated barrier film 31 is formed, for example, of the same material as the laminated barrier film 30.

An upper contact 33 formed of W is embedded in the contact hole 29 deposited with the laminated barrier film 31. The upper contact 33 fills up the contact hole 29 and an upper surface thereof is flush with the upper surface of the interlayer film 27. With the upper contact 33, the aluminum wire 55 and the upper electrode 26 are electrically connected.

Figure 2:
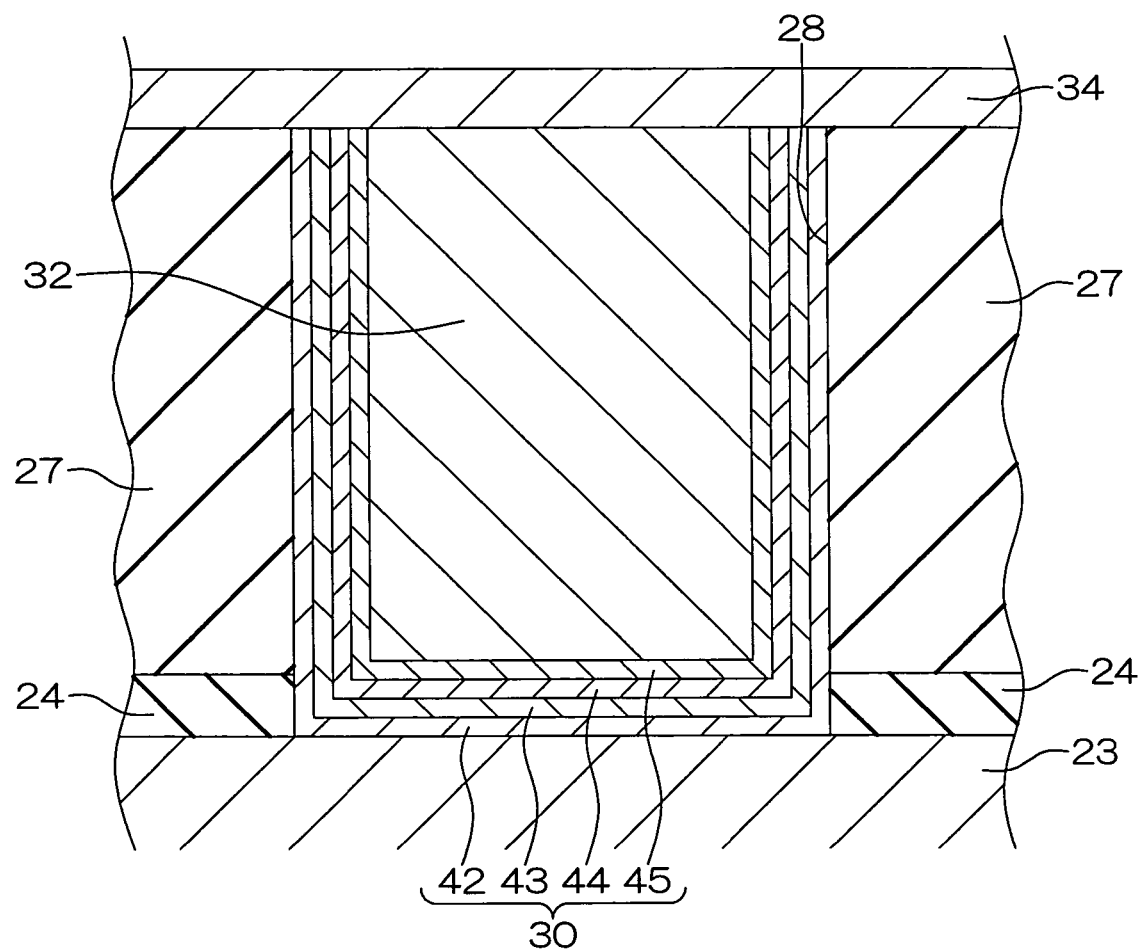
FIG. 2 is an enlarged view of a portion surrounded by a circle A in FIG. 1.

FIG. 2 is an enlarged view of a portion surrounded by a circle A in FIG. 1.

A specific arrangement of the laminated barrier film 30 shall now be described with reference to FIG. 2.

The laminated barrier film 30 is interposed between the copper wire 23 and the tungsten plug 32 and has a laminated structure formed by lamination of a plurality of layers. In the present embodiment, the laminated barrier film 30 has a four-layer laminated structure made of a tantalum barrier film 42, a tantalum nitride barrier film 43, a titanium barrier film 44, and a titanium nitride barrier film 45.

The tantalum barrier film 42 is formed of tantalum (Ta) and is deposited onto the side surface of the via hole 28 and an upper surface of the copper wire 23. By being deposited onto the upper surface of the copper wire 23, the tantalum barrier film 42 is in contact with the copper wire 23. The tantalum barrier film 42 has a film thickness, for example, of 2 nm to 20 nm.

The tantalum nitride barrier film 43 is formed of tantalum nitride (TaN) and is laminated onto the tantalum barrier film 42. The tantalum nitride barrier film 43 has a film thickness, for example, of 2 nm to 20 nm.

The titanium barrier film 44 is formed of titanium and is laminated onto the tantalum nitride barrier film 43. The titanium barrier film 44 has a film thickness, for example, of 3 nm to 30 nm.

The titanium nitride barrier film 45 is formed of titanium nitride and is laminated onto the titanium barrier film 44. The titanium nitride barrier film 45 constitutes an uppermost layer of the laminated barrier film 30 and is formed to be in contact with a surface of the tungsten plug 32. The titanium nitride barrier film 45 has a film thickness, for example, of 2 nm to 20 nm.

Figure 3A:
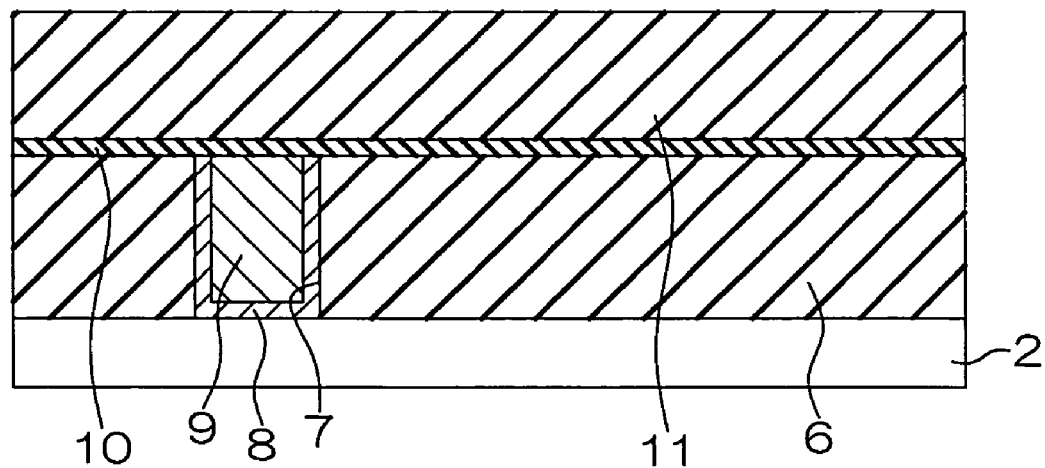
FIG. 3A is a schematic sectional view showing a manufacturing step of the semiconductor device shown in FIG. 1.
Figure 3B:
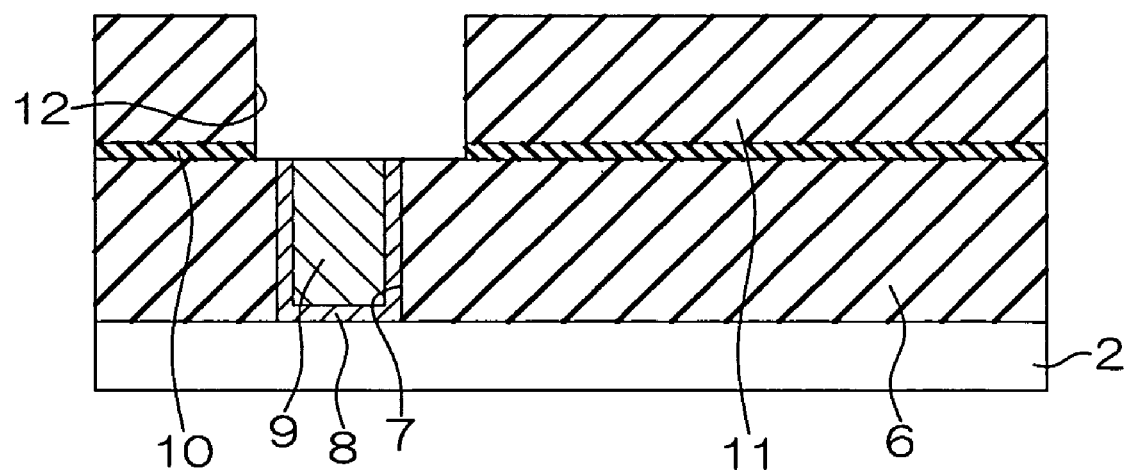
FIG. 3B is a schematic sectional view showing a step subsequent to FIG. 3A.
Figure 3C:
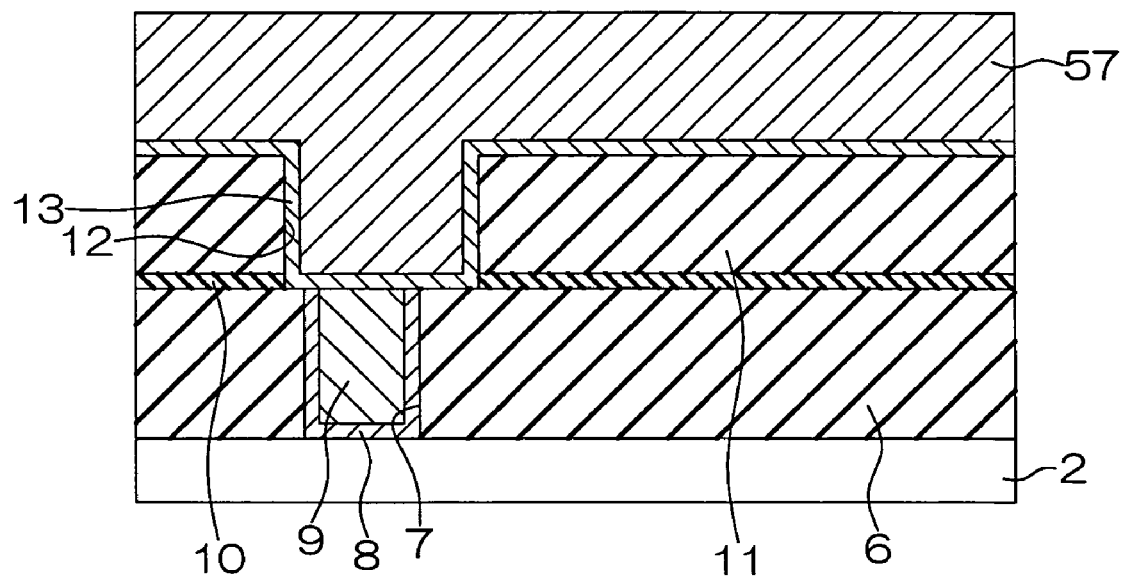
FIG. 3C is a schematic sectional view showing a step subsequent to FIG. 3B.
Figure 3D:
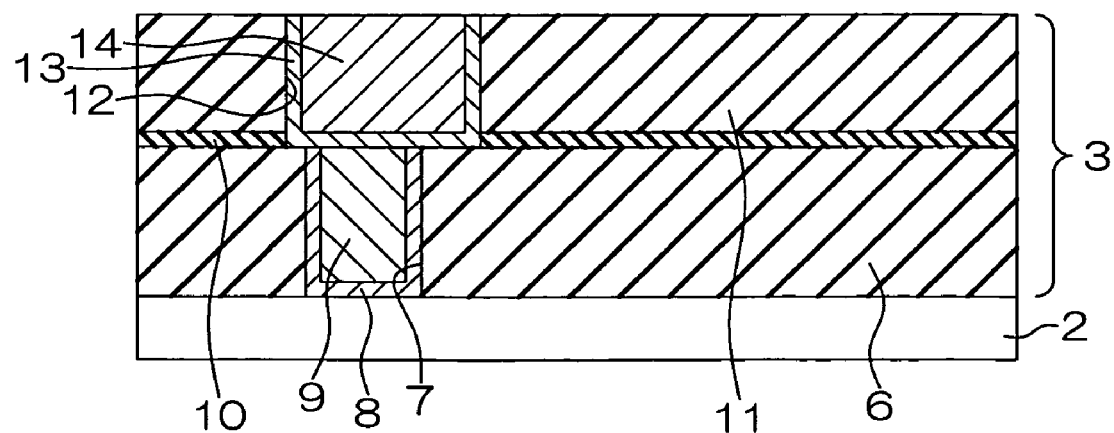
FIG. 3D is a schematic sectional view showing a step subsequent to FIG. 3C.
Figure 3E:
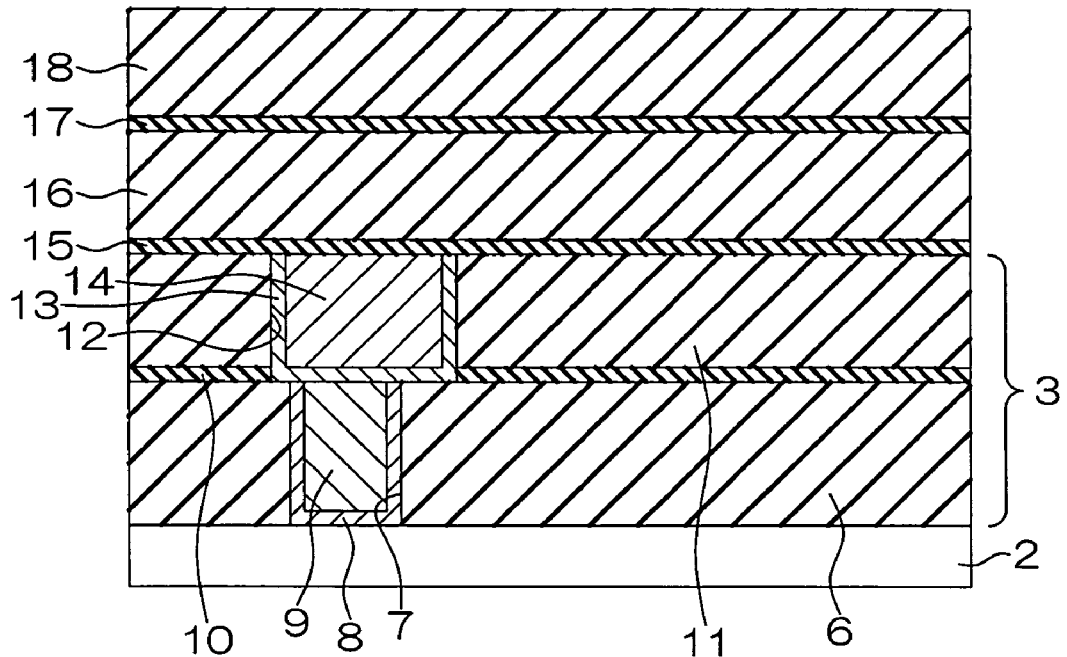
FIG. 3E is a schematic sectional view showing a step subsequent to FIG. 3D.
Figure 3F:
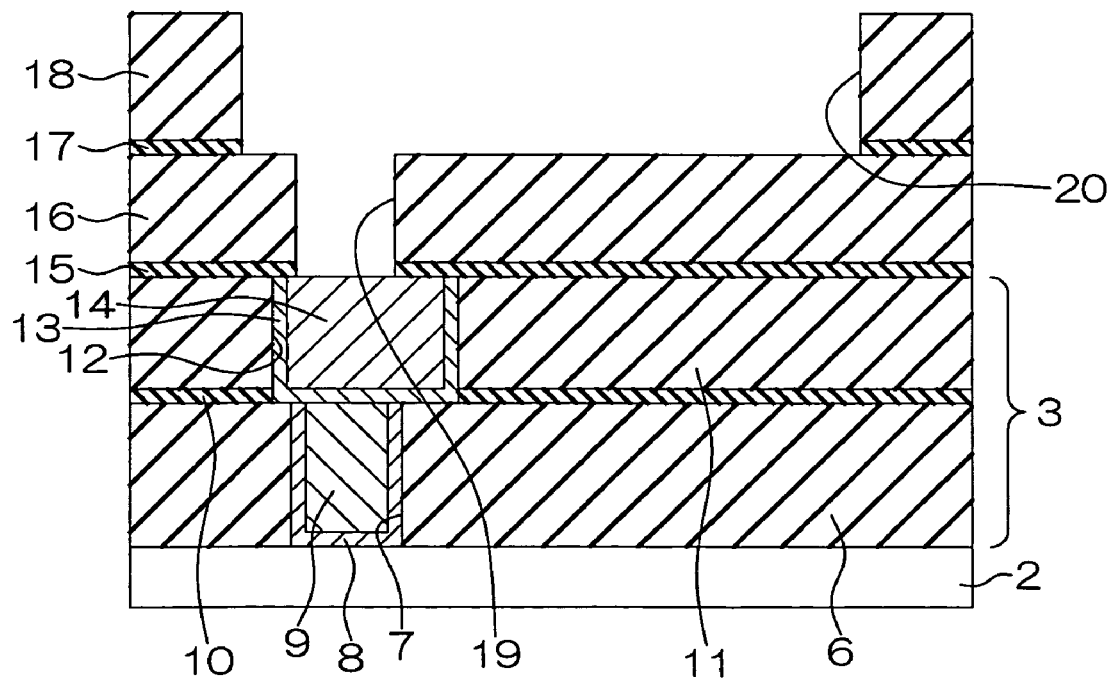
FIG. 3F is a schematic sectional view showing a step subsequent to FIG. 3E.
Figure 3G:
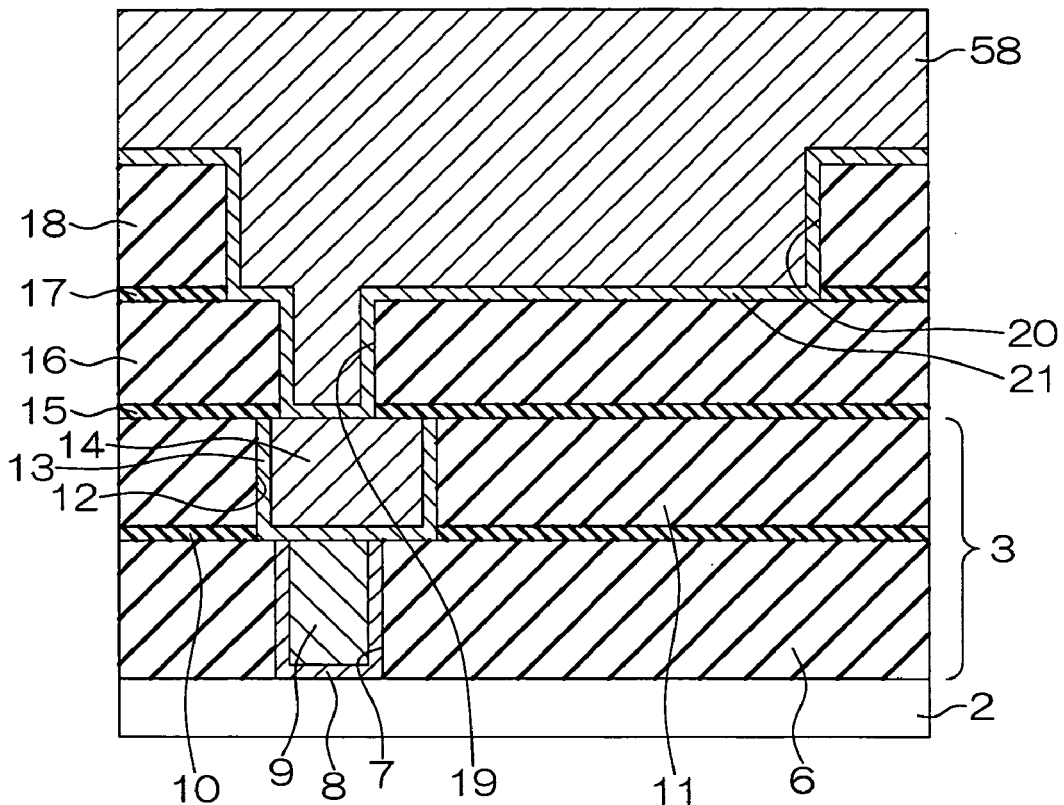
FIG. 3G is a schematic sectional view showing a step subsequent to FIG. 3F.
Figure 3H:
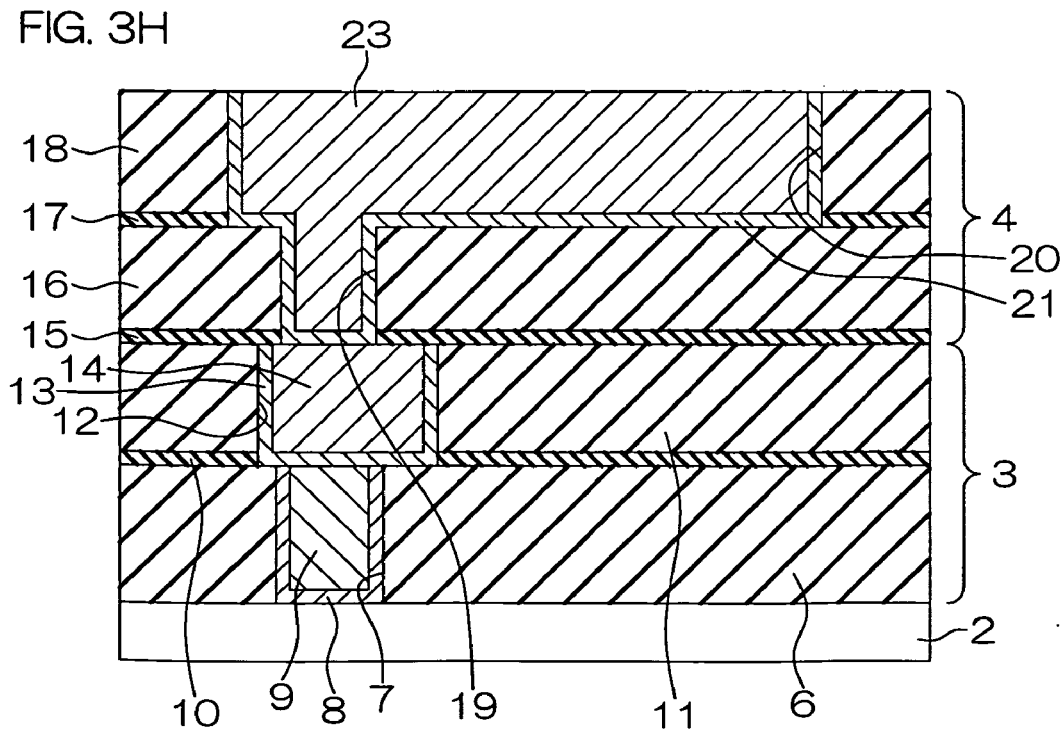
FIG. 3H is a schematic sectional view showing a step subsequent to FIG. 3G.
Figure 3:
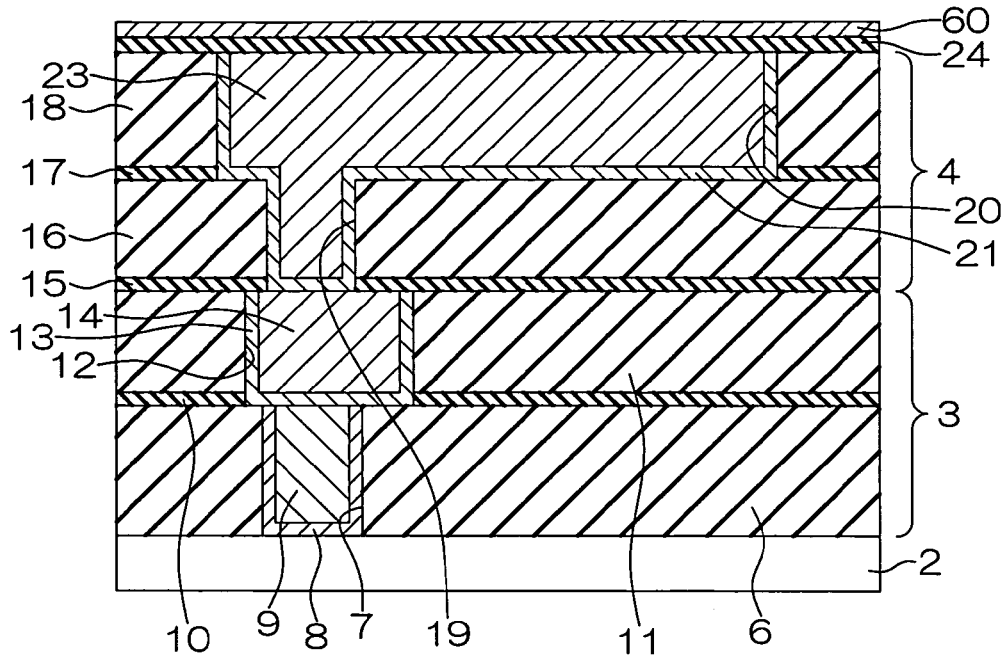
FIG. 3I is a schematic sectional view showing a step subsequent to FIG. 3H.
FIG. 3J is a schematic sectional view showing a step subsequent to FIG. 3I.
FIG. 3K is a schematic sectional view showing a step subsequent to FIG. 3J.
FIG. 3L is a schematic sectional view showing a step subsequent to FIG. 3K.
FIG. 3M is a schematic sectional view showing a step subsequent to FIG. 3L.
FIG. 3N is a schematic sectional view showing a step subsequent to FIG. 3M.
FIG. 3O is a schematic sectional view showing a step subsequent to FIG. 3N.
FIG. 3P is a schematic sectional view showing a step subsequent to FIG. 3O.
FIG. 3Q is a schematic sectional view showing a step subsequent to FIG. 3P.
Figure 3J:
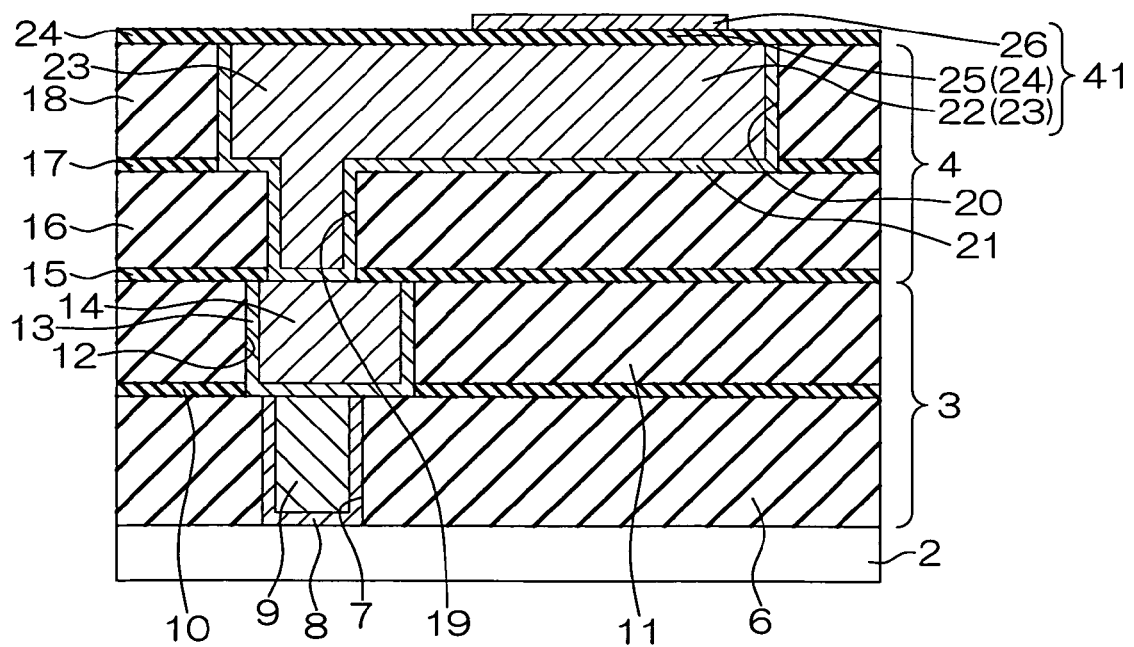
Figure 3K:
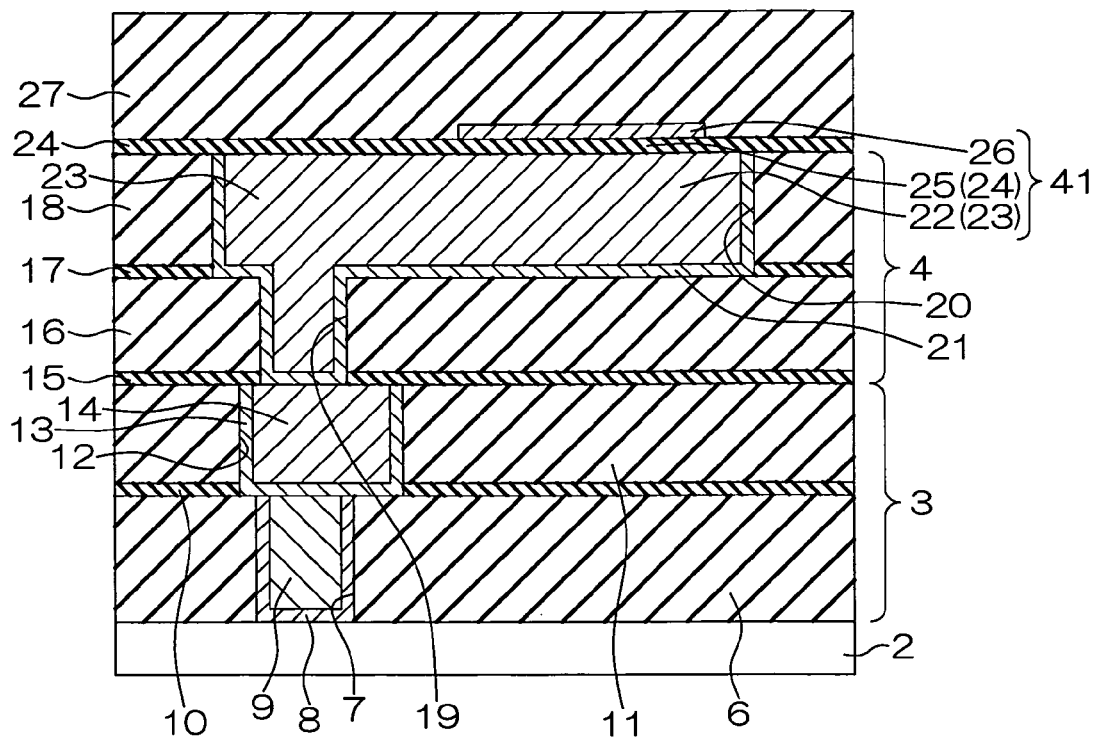
Figure 3L:
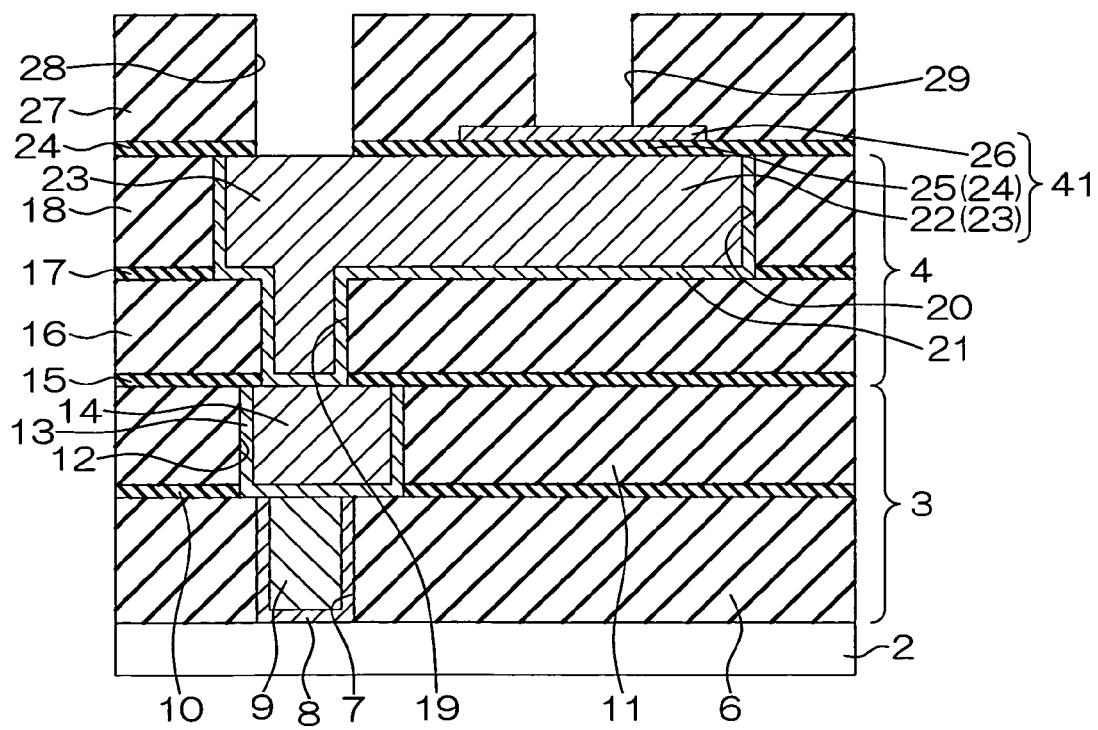
Figure 3M:
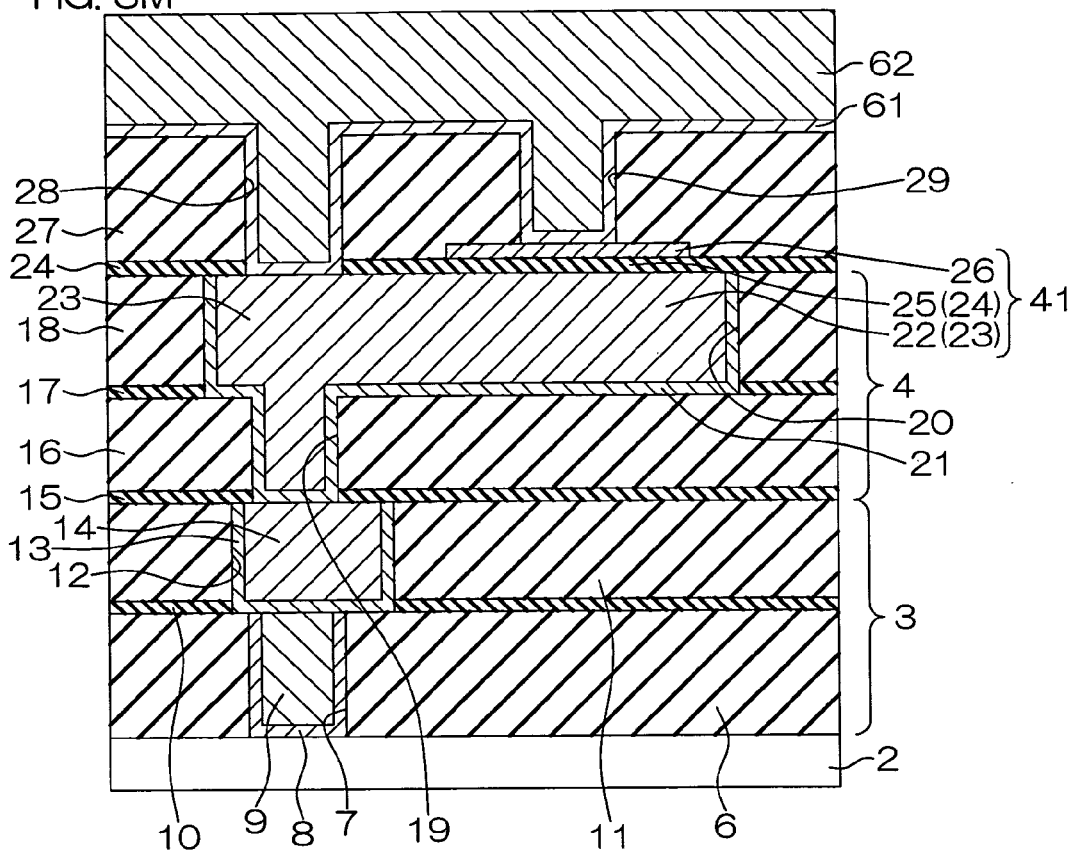
Figure 3N:
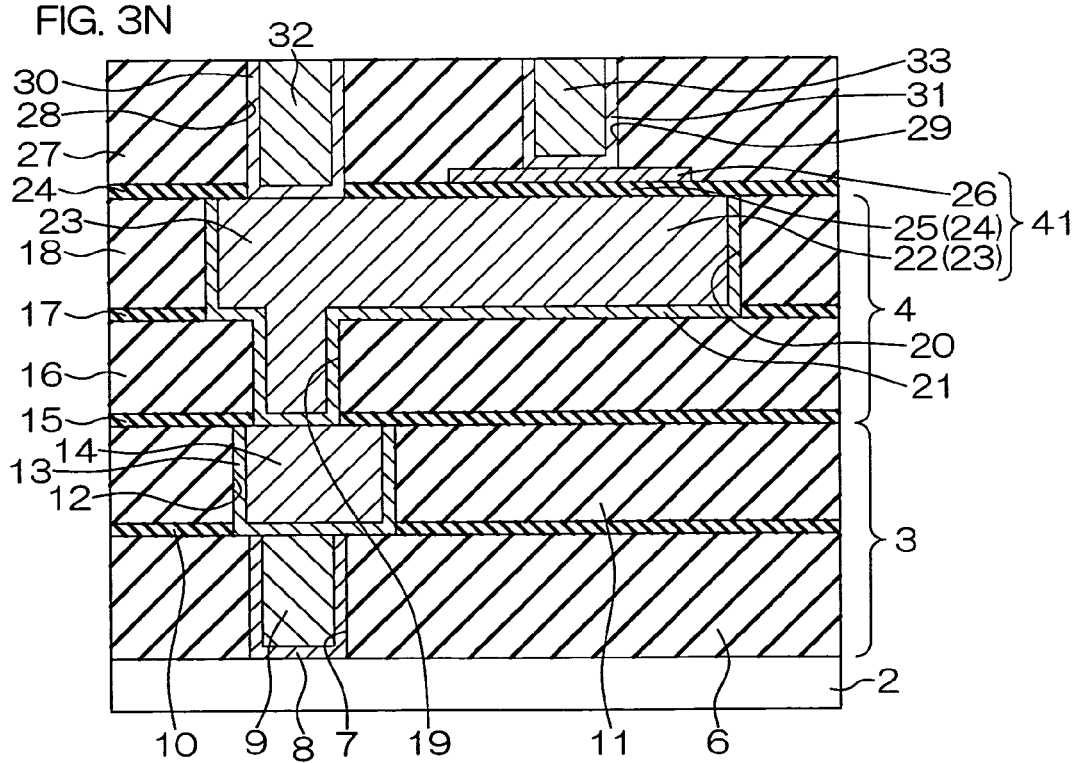
Figure 3P:
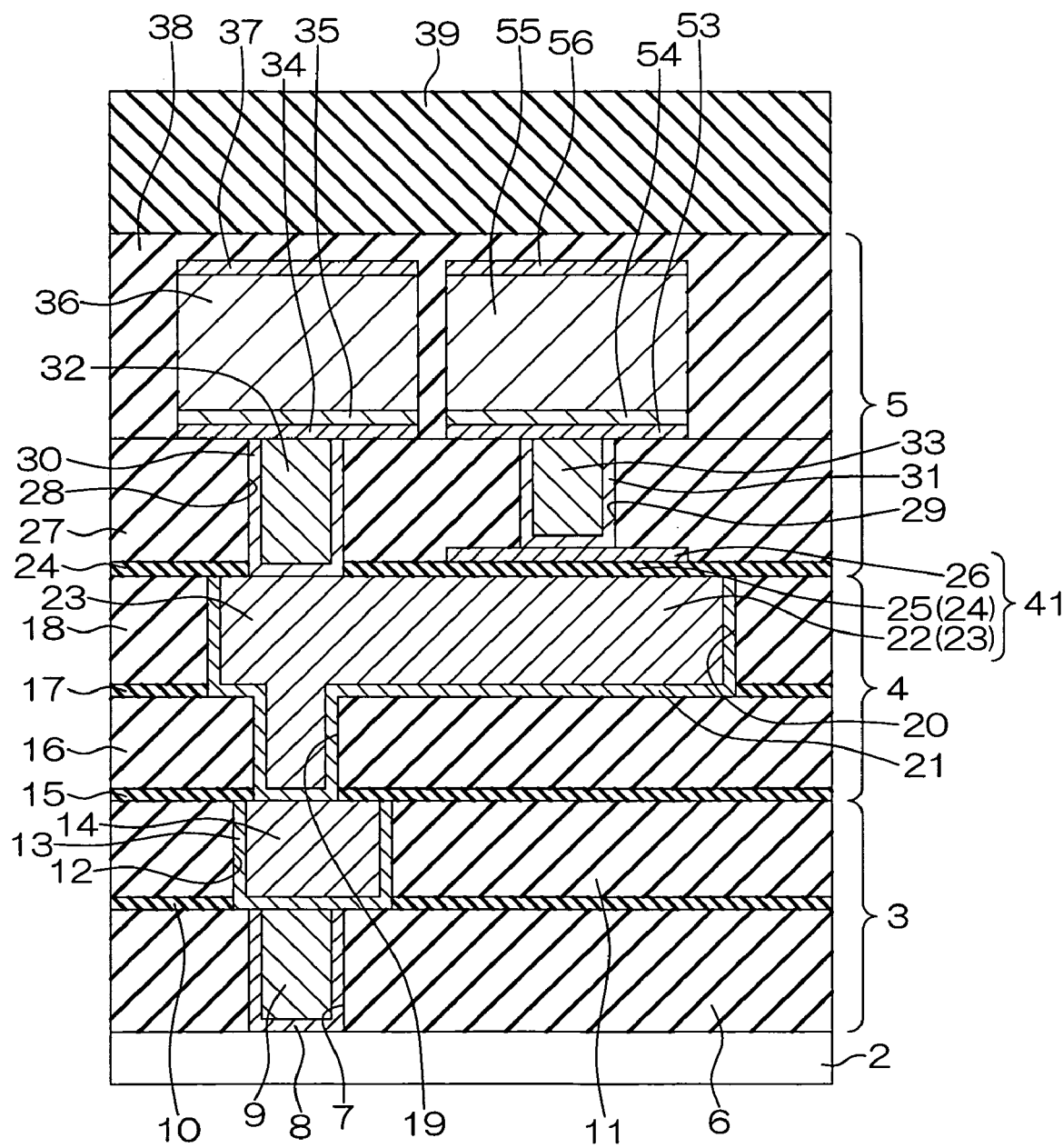
Figure 3Q:
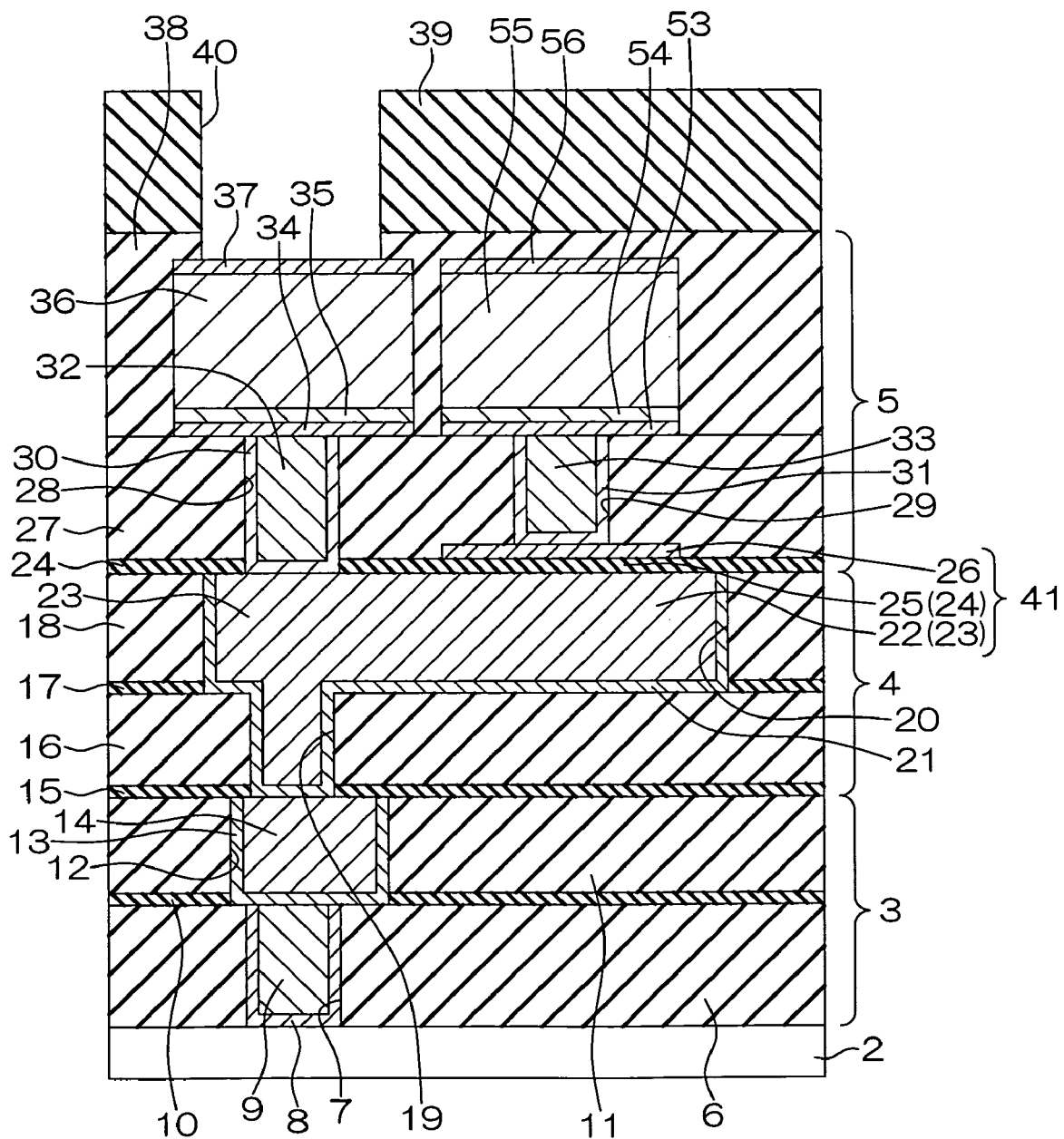

FIGS. 3A to 3Q are stepwise schematic sectional views showing a method for manufacturing the semiconductor device 1.

The method for manufacturing the semiconductor device 1 shall now be described with reference to FIGS. 3A to 3Q.

In manufacturing the semiconductor device 1, first, the interlayer film 6 is formed on the semiconductor substrate 2, for example, by a CVD (chemical vapor deposition) method.

The contact hole 7 is then formed in the interlayer film 6 by a known photolithography technique and etching technique (for example, dry etching). After the contact hole 7 is formed, the titanium nitride barrier film 8 is deposited, for example, by the CVD method onto the entire surface of the interlayer film 6 including the interior of the contact hole 7. By using the CVD method to form the titanium nitride barrier film 8, the titanium nitride barrier film 8 can be deposited onto the interlayer film 6 with good coverage even when the contact hole 7 is small in opening diameter.

A W film formed of W is then deposited on the titanium nitride barrier film 8, for example by the CVD method using $WF_6$ gas (tungsten hexafluoride gas) (this method shall hereinafter be referred to as the "W-CVD method").

The W film and the titanium nitride barrier film 8 are then polished by a CMP (chemical mechanical polishing) method. This polishing treatment removes all unnecessary portions of the W film and the titanium nitride barrier film 8 that are formed outside the contact hole 7. Consequently, the W film becomes the tungsten plug 9. The diffusion preventing film 10 and the interlayer film 11 are then formed, for example, by the CVD method on the interlayer film 6 including the upper surface of the tungsten plug 9.

Then as shown in FIG. 3B, the wiring groove 12 of the predetermined pattern that penetrates through the interlayer film 11 and the diffusion preventing film 10 is formed by the known photolithography technique and etching technique (for example, dry etching).

Then as shown in FIG. 3C, the tantalum barrier film 13 is deposited, for example, by the CVD method onto the entire surface of the interlayer film 11 including the interior of the wiring groove 12. After the tantalum barrier film 13 is deposited, a copper film 57 formed of a metal having copper as a main component is formed on the tantalum barrier film 13, for example, by a plating method. The copper film 57 is formed in a thickness to fill up the wiring groove 12 and cover the entire surface of the tantalum barrier film 13.

Then as shown in FIG. 3D, the copper film 57 and the tantalum barrier film 13 are polished by the CMP method. The portion of the copper film 57 embedded in the wiring groove 12 thereby becomes the copper wire 14. The first wiring layer 3 is thus obtained.

After the copper wire 14 is formed, the diffusion preventing film 15, the interlayer film 16, the etch stop film 17, and the interlayer film 18 are formed in that order, for example, by the CVD method on the interlayer film 11 including the upper surface of the copper wire 14, as shown in FIG. 3E.

Then as shown in FIG. 3F, by a so-called dual damascene forming technique using the known photolithography technique and etching technique (for example, dry etching), the wiring groove 20 of the predetermined pattern, penetrating through the interlayer film 18 and the etch stop film 17, and the via hole 19 penetrating through the interlayer film 16 and the diffusion preventing film 15 are formed.

Then as shown in FIG. 3G, the tantalum barrier film 21 is deposited, for example, by the CVD method on the entire surface of the interlayer film 18 including the interior of the wiring groove 20.

After the tantalum barrier film 21 is deposited, a copper film 58 formed of a metal having copper as a main component is formed on the tantalum barrier film 21, for example, by the plating method. The copper film 58 is formed in a thickness to fill up the wiring groove 20 and cover the entire surface of the tantalum barrier film 21.

Then as shown in FIG. 3H, the copper film 58 and the tantalum barrier film 21 are polished by the CMP method. The portion of the copper film 58 embedded in the wiring groove 20 thereby becomes the copper wire 23. The second wiring layer 4 is thus obtained.

After the copper wire 23 is formed, the diffusion preventing film 24 (capacitive film 25) and a titanium nitride film 60 are formed in that order, for example, by the CVD method on the interlayer film 18 including the upper surface of the copper wire 23, as shown in FIG. 3I.

Then as shown in FIG. 3J, by the known photolithography technique and etching technique (for example, dry etching), the titanium nitride film 60 is etched, and the etching is stopped on the diffusion preventing film 24. The MIM capacitor 41 is thereby formed.

Then as shown in FIG. 3K, the interlayer film 27 is formed, for example, by the CVD method on the diffusion preventing film 24 including a region above the MIM capacitor 41.

The via hole 28 penetrating through the interlayer film 27 and the diffusion preventing film 24 and reaching the upper surface of the copper wire 23, and the contact hole 29 penetrating through the interlayer film 27 and reaching the upper surface of the upper electrode 26 are then formed by the known photolithography technique and etching technique (for example, dry etching).

After the via hole 28 and the contact hole 29 are formed, a laminated barrier film 61 is formed by laminating a tantalum film formed of tantalum, a tantalum nitride film formed of tantalum nitride, a titanium film formed of titanium, and a titanium nitride film formed of titanium nitride for example, by the CVD method on the entire surface of the interlayer film 27 including the interiors of the holes, as shown in FIG. 3M. By using the CVD method to form the laminated barrier film 61, the laminated barrier film 61 can be deposited onto the interlayer film 27 with good coverage even when the via hole 28 and the contact hole 29 are small in opening diameter. Thereafter, a W film 62 formed of W is deposited on the laminated barrier film 61, for example, by the W-CVD method.

Then as shown in FIG. 3N, the W film 62 and the laminated barrier film 61 are polished by the CMP method. The portion of the laminated barrier film 61 deposited on the side surfaces of the via hole 28 and the upper surface of the copper wire 23 therefore becomes the laminated barrier film 30, and the portion of the laminated barrier film 61 deposited on the side surfaces of the contact hole 29 and the upper surface of the upper electrode 26 becomes the laminated barrier film 31. The portion of the W film 62 remaining inside the via hole 28 becomes the tungsten plug 32 and the portion remaining inside the contact hole 29 becomes the upper contact 33.

Then as shown in FIG. 3O, a titanium film formed of titanium, a titanium nitride film formed of titanium nitride, an aluminum film formed of a metal having aluminum as a main component, and a titanium nitride film formed of titanium nitride are formed sequentially on the interlayer film 27, for example, by a sputtering method. Accordingly, a laminated film is formed that includes the titanium film, the titanium nitride film, the aluminum film, and the titanium nitride film.

The laminated film is then formed to a predetermined pattern by the known photolithography technique and etching technique (for example, dry etching). The aluminum wire 36 and the aluminum wire 55 are thereby formed on the interlayer film 27.

Then as shown in FIG. 3P, the interlayer film 38 is formed, for example, by the CVD method on the interlayer film 27 including the regions above the aluminum wire 36 and the aluminum wire 55. The third wiring layer 5 is there by obtained. Furthermore, the surface protective film 39 is formed on the interlayer film 38, for example, by the CVD method.

Then as shown in FIG. 3Q, the pad opening 40 penetrating through the surface protective film 39 and the interlayer film 38 and exposing the aluminum wire 36 is formed by the known photolithography technique and etching technique (for example, dry etching).

The semiconductor device 1 made in the three-layer structure of the first wiring layer 3, the second wiring layer 4, and the third wiring layer 5, is thereby obtained.

As described above, in the semiconductor device 1 having the multilayer wiring structure, the pad opening 40 is formed in the surface protective film 39 and the interlayer film 38. The portion of the aluminum wire 36 facing the interior of the pad opening 40 is exposed as the electrode pad for electrical connection with the external portion.

Because the aluminum wire 36 that is exposed as the electrode pad from the pad opening 40 is made of the metal having aluminum having excellent corrosion resistance as the main component, even if the portion of the aluminum wire 36 that corresponds the electrode pad is left in the exposed state from the pad opening 40, this portion does not corrode. A semiconductor device having an electrode pad with a high reliability of electrical connection with an external portion can thus be realized.

The aluminum wire 36 is formed on the third wiring layer 5, which is a portion of the wires of the multilayer wiring structure. A step of forming the layer (third wiring layer 5) on which the aluminum wire 36 is provided is included in the steps for forming the multilayer wiring layers. Therefore, the number of steps of a process for manufacturing the semiconductor device 1 as a whole is not increased due to the forming of the layer (third wiring layer 5) in which the aluminum wire 36 is provided. Consequently, increase of manufacturing cost of the semiconductor device can be prevented. That is, the aluminum wire 36 is an uppermost layer wire in the multilayer wiring structure and, at the same time, a portion thereof functions as the electrode pad.

The semiconductor device 1 includes the MIM capacitor 41. The lower electrode 22 of the MIM capacitor 41 is made of a portion of the copper wire 23. Forming of the lower electrode 22 is thus achieved by forming of the copper wire 23. Thus in comparison to a case where an MIM capacitor is prepared separately from the steps of forming the multilayer wiring layers, the semiconductor device 1 having the MIM capacitor 41 can be manufactured at low cost.

As described above, because the plug embedded in the via hole 28 is the tungsten plug 32 (see FIG. 3N), the laminated film made of the titanium film, the titanium nitride film, the aluminum film, and the titanium nitride film can be patterned readily in a subsequent step. The manufacturing process can thus be simplified. By simplification of the manufacturing process, the manufacturing cost can be reduced.

The titanium nitride barrier film 45 is the portion of the laminated barrier film 30 that contacts the tungsten plug 32. Thus even when $WF_6$ gas is supplied on to the laminated barrier film 30 (see FIG. 3M), the $WF_6$ gas can be prevented from diffusing into the interlayer film 27 and corroding the interlayer film 27.

The tungsten plug 32 contacts the titanium nitride barrier film 45, which is excellent in adhesion with W in the laminated barrier film 30. Thus adhesion of the laminated barrier film 30 and the tungsten plug 32 can be improved. Meanwhile, the copper wire 23 contacts the tantalum barrier film 42, which is excellent in adhesion with copper in the laminated barrier film 30. Thus adhesion of the laminated barrier film 30 and the copper wire 23 can be improved. Accordingly, film peeling of the laminated barrier film 30 can be prevented. Therefore, occurrence of stress migration can be prevented. Furthermore, because the titanium nitride barrier film 45 and the copper wire 23 are not in contact and because tantalum has low reactivity with copper, corrosion of the copper wire 23 does not occur. Thus occurrence of electromigration can thus be prevented.

Consequently, reliability of connection of the copper wire 23 (second wiring layer 4) and the aluminum wire 36 (third wiring layer 5) can be improved.

Figure 4:
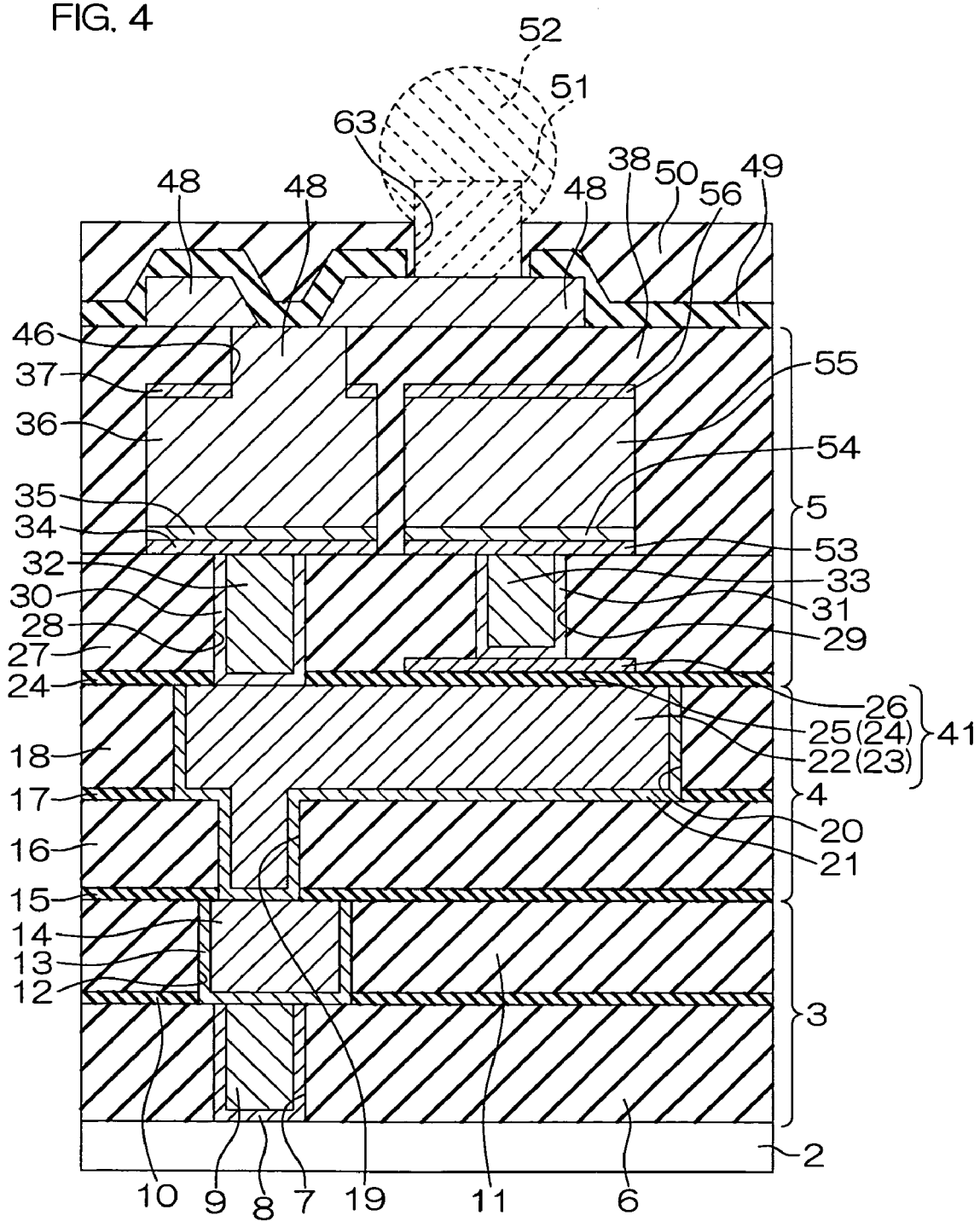
FIG. 4 is a schematic sectional view showing an arrangement of a semiconductor device according to a second embodiment of the present invention.

FIG. 4 is a schematic sectional view showing an arrangement of a semiconductor device 47 according to a second embodiment of the present invention. In FIG. 4, portions corresponding to portions shown in FIG. 1 are provided with the same reference symbols as those of FIG. 1.

In the arrangement shown in FIG. 4, the semiconductor device 47 is a semiconductor device to which a WL-CSP (wafer level-chip size package) technique is applied.

In the semiconductor device 47, a penetrating hole 46 reaching the aluminum wire 36 is formed in the interlayer film 38. A portion of the aluminum wire 36 facing the penetrating hole 46 is exposed via the penetrating hole 46. An aluminum rewire 48 is connected to the aluminum wire 36, having aluminum as a main component and drawn out on the surface of the interlayer film 38 via the penetrating hole 46. A portion of the aluminum rewire 48 drawn out on the surface of the interlayer film 38 is coated with a surface protective film 49 formed of SiN.

A protective film 50 formed of polyimide is laminated on the surface protective film 49. In the protective film 50 and the surface protective film 49, a connection opening 63 is formed that penetrates through the films in the film thickness direction. A portion of the aluminum rewire 48 that faces the connection opening 63 is exposed via the connection opening 63.

A post 51 formed of a material having Cu as a main component is connected to the exposed aluminum rewire 48 via the connection opening 63.

An end of the post 51 at an opposite side of a side connected to the aluminum rewire 48 projects from the protective film 50. The projecting portion of the post 51 is connected to a solder bump 52 for electrical connection with an external portion.

The same effects as those of the semiconductor device 1 are exhibited also by the arrangement shown in FIG. 4.

In the semiconductor device 1 shown in FIG. 1 and the semiconductor device 47 shown in FIG. 4, the tungsten plug 32 formed of W is employed as the plug for connecting the aluminum wire 36 (upper wire) and the copper wire 23 (lower wire).

Figure 5A:
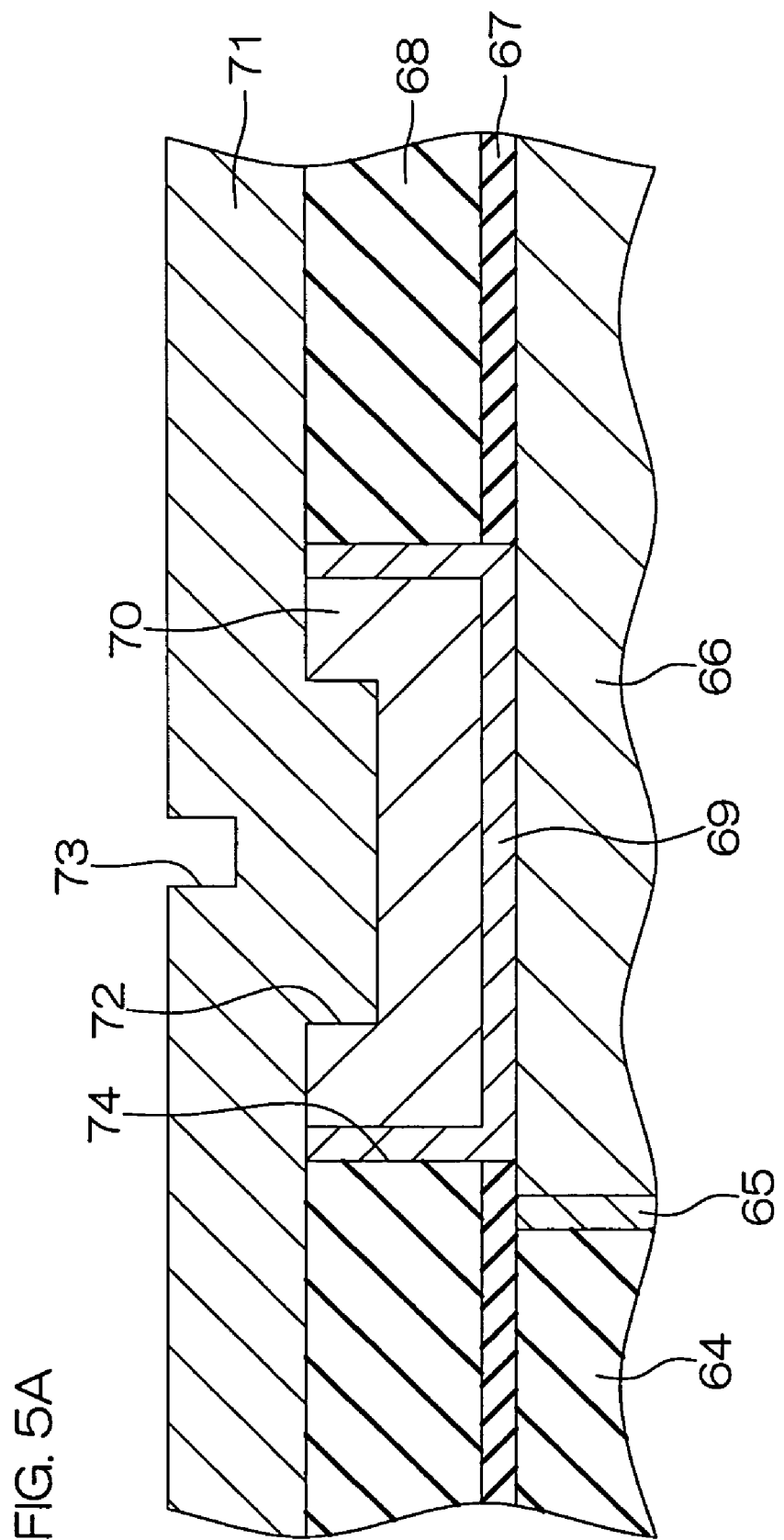
FIG. 5A is a schematic sectional view for describing a method for forming a structure connecting an aluminum wire (upper wire) and a copper wire (lower wire) that are connected with a tungsten plug.
Figure 5B:
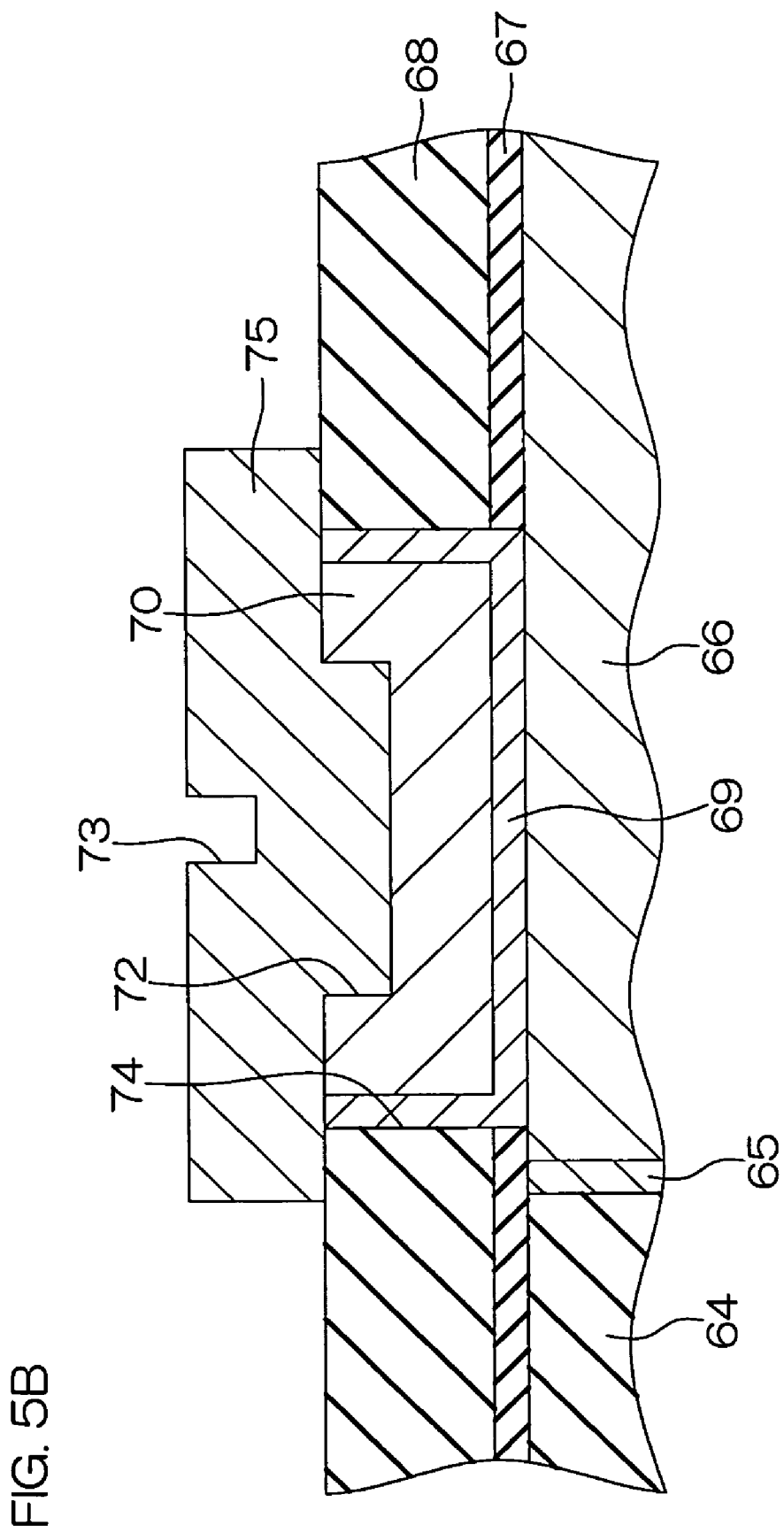
FIG. 5B is schematic sectional view showing a step subsequent to FIG. 5A.

FIGS. 5A and 5B are schematic sectional views for describing a method for forming a structure connecting an aluminum wire (upper wire) and a copper wire (lower wire) that are connected with a tungsten plug.

To connect the upper wire and the lower wire using the W plug, first, for example, a copper wire 66 (lower wire) having copper as a main component is embedded via a barrier film 65 (for example, the tantalum barrier film 21 in the embodiments) in a surface layer portion of an interlayer film 64 formed of $SiO_2$.

A diffusion preventing film 67 formed of SiC and an interlayer film 68 formed of $SiO_2$ are then laminated on the interlayer film 64. Next, a via hole 74 penetrating through the interlayer film 68 and the diffusion preventing film 67 is formed at portions of the films that oppose the copper wire 66.

Thereafter, a barrier film (for example, the laminated barrier film 61 in the embodiment) and a W film (for example, the W film 62 in the embodiment) are laminated on the entire surface of the interlayer film 68 including an interior of the via hole 74, for example, by a CVD method.

After the barrier film and the W film are laminated, all portions of these films outside the interlayer film 68 are polished. Accordingly, the barrier film remaining inside the via hole 74 becomes a barrier film 69, and the W film remaining inside the via hole 74 becomes a tungsten plug 70. The tungsten plug 70 is formed to have a recess 72 that is recessed with respect to a surface of the interlayer film 68.

An aluminum film 71 is then sputtered onto the interlayer film 68. Because the recess 72 is formed on the tungsten plug 70, the aluminum film 71 is formed to a shape having a recess 73 at a portion immediately above the recess 72.

The aluminum film 71 is then patterned to a predetermined wiring pattern by the photolithography technique, and an aluminum wire 75 (upper wire) of the predetermined pattern is obtained as shown in FIG. 5B. In patterning the aluminum film 71, the aluminum film 71 may be patterned using the recess 73 of the aluminum film 71 as a mark.

Thus in the semiconductor device having the same connection structure as the connection structure of the aluminum wire 75 and the copper wire 66 that are connected with the tungsten plug 70, that is, in the semiconductor device 1 shown in FIG. 1 and the semiconductor device 47 shown in FIG. 4, the upper wire (for example, the aluminum wire 36 in FIGS. 1 and 4) formed on the W plug can be patterned readily. Because the process for manufacturing the semiconductor device 1 and the semiconductor device 47 can thus be simplified, the manufacturing cost can be reduced.

Although a plurality of embodiments of the present invention are described above, the present invention can also be put into practice in other forms.

For example, in the embodiment, the laminated barrier film 30 is made of the four-layer structure of the tantalum barrier film 42, the tantalum nitride barrier film 43, the titanium barrier film 44, and the titanium nitride barrier film 45. However, as long as the film in contact with the copper wire 23 is a tantalum barrier film and the film in contact with the tungsten plug 32 is a titanium nitride barrier film, the laminated structure may have an arrangement such as those described in 1 to 5 below.

(Laminated Structure of the Laminated Barrier Film 30)

1. Copper wire 23/tantalum barrier film/tantalum nitride barrier film/tantalum barrier film/titanium barrier film/titanium nitride barrier film/tungsten plug 32

2. Copper wire 23/tantalum barrier film/tantalum nitride barrier film/tantalum barrier film/titanium nitride barrier film/tungsten plug 32

3. Copper wire 23/tantalum barrier film/tantalum nitride barrier film/titanium nitride barrier film/tungsten plug 32

4. Copper wire 23/tantalum barrier film/titanium barrier film/titanium nitride barrier film/tungsten plug 32

5. Copper wire 23/tantalum barrier film/titanium nitride barrier film/tungsten plug 32

In a structure, such as laminated structure 1 and laminated structure 2 among the laminated structures 1 to 5, where a tantalum nitride barrier film is sandwiched by tantalum barrier films, the copper diffusion preventing performance of the laminated barrier film 30 can also be improved.

Further, in the above-described embodiments, only the wire in the uppermost third wiring layer 5 is formed as the aluminum wire having aluminum as the main component. However, for example, the wire in the lowermost first wiring layer 3 may also be formed as an aluminum wire.

Further, in the embodiments, the copper wire 23 and the aluminum wire 36 are electrically connected using the tungsten plug 32. However, the electrical connection can be achieved using, for example, a copper plug formed of a metal having copper as a main component in place of the tungsten plug 32.

In the above-described embodiments, the respective interlayer films (6, 11, 16, 18, 27, and 38) are formed using $SiO_2$.

However, these may be formed using a low dielectric constant material (low-k material), such as SiOC, SiOF.

In the above-described embodiments, the respective diffusion preventing films (10, 15, and 24) and the etch stop film 17 are formed using SiC. However, these may be formed using SiN.

Although embodiments of the present invention are described in detail above, these are merely specific examples used for clarifying the technical features of the present invention. The present invention should not be interpreted limitative to these specific examples, and the spirit and scope of the present invention are limited only by the attached claims.

The present application corresponds to Japanese Patent Application No. 2007-145809 filed with the Japan Patent Office on May 31, 2007 and the entire disclosure of this application is incorporated herein by reference.

What is claimed is:

1. A semiconductor device having a multilayer wiring structure laminating and disposing a plurality of wires sandwiched by insulating films, the semiconductor device comprising:
    a plurality of copper wires, disposed in the multilayer wiring structure, each of the copper wires having copper as a main component;
    an insulating film formed on an uppermost one of the copper wires in the multilayer wiring structure;
    a first aluminum wire having aluminum as a main component and formed on the insulating film to be electrically connected to the uppermost copper wire via a first plug formed to penetrate through the insulating film;
    a surface protective film formed on the first aluminum wire and formed with a pad opening exposing a portion of the first aluminum wire as an electrode pad for electrical connection with an external portion;
    a lower electrode in a metal-insulator-metal (MIM) capacitor, formed of a portion of the uppermost copper wire connected to the first plug;
    a capacitive film in the MIM capacitor, formed on the lower electrode;
    an upper electrode in the MIM capacitor, formed on the capacitive film; and
    a second aluminum wire having aluminum as a main component and formed on the insulating film to be electrically connected to the upper electrode via an upper contact having a main component that is the same material as a main component of the first plug, the upper contact being formed to penetrate through the insulating film in a layer in which the first plug is formed.

2. The semiconductor device according to claim 1, wherein the first plug is a tungsten plug.

3. The semiconductor device according to claim 2, further comprising a barrier layer interposed between the uppermost copper wire and the first tungsten plug,
    wherein the barrier layer includes a tantalum film contacting the uppermost copper wire and a titanium nitride film contacting the first tungsten plug.

4. The semiconductor device according to claim 1, wherein the second aluminum wire is formed opposite to the upper electrode through the insulating film.

5. The semiconductor device according to claim 1, wherein the upper electrode is completely covered so that no portion thereof is exposed to outside contact.

6. The semiconductor device according to claim 3, wherein the barrier layer further includes a tantalum nitride barrier film and a titanium barrier film between the tantalum film and the titanium nitride film.

7. The semiconductor device according to claim 1, wherein
    the capacitive film is formed of a portion of a diffusion preventing film laminated on a layer within the uppermost copper wire, and
    the capacitive film has both a function as a diffusion preventing film and a function as a capacitive film.

8. The semiconductor device according to claim 7, wherein the capacitive film is formed of SiC.

9. The semiconductor device according to claim 1, wherein
    a diffusion preventing film layer is formed of a predetermined material in the multilayer wiring structure, and
    the capacitive film is formed of a material that is the same as the predetermined material.

10. The semiconductor device according to claim 3, wherein the upper electrode is formed of a material that is the same as a material of a part of the barrier layer.

11. The semiconductor device according to claim 6, wherein
    the barrier layer further includes a further titanium barrier film between the tantalum film and the titanium nitride film, and
    the tantalum nitride barrier film is sandwiched by the titanium barrier film and the further titanium barrier film.

12. A semiconductor device, comprising:
    a plurality of copper wires, each of the copper wires having copper as a main component;
    an insulating film formed on an uppermost one of the copper wires;
    a first aluminum wire having aluminum as a main component and formed on the insulating film to be electrically connected to the uppermost copper wire via a first plug that is formed to penetrate through the insulating film in a first layer;
    a surface protective film formed on the first aluminum wire and formed with a pad opening exposing a portion of the first aluminum wire as an electrode pad for electrical connection with an external portion;
    a lower electrode formed of a portion of the uppermost copper wire;
    a capacitive film formed on the lower electrode;
    an upper electrode formed on the capacitive film; and
    a second aluminum wire having aluminum as a main component and formed on the insulating film to be electrically connected to the upper electrode via an upper contact having a main component that is the same material as a main component of the first plug, the upper contact being formed to penetrate through the insulating film in the first layer.

* * * * *